United States Patent
Bour et al.

(10) Patent No.: US 6,875,627 B2
(45) Date of Patent: Apr. 5, 2005

(54) STRUCTURE AND METHOD FOR INDEX-GUIDED BURIED HETEROSTRUCTURE ALGAINN LASER DIODES

(75) Inventors: David P. Bour, Cupertino, CA (US); Michael A. Kneissl, Mountain View, CA (US); Linda T. Romano, Sunnyvale, CA (US)

(73) Assignee: Xerox Corporation, Stamford, CT (US)

( * ) Notice: Subject to any disclaimer, the term of this patent is extended or adjusted under 35 U.S.C. 154(b) by 79 days.

(21) Appl. No.: 10/025,462

(22) Filed: Dec. 26, 2001

(65) Prior Publication Data

US 2002/0094003 A1 Jul. 18, 2002

Related U.S. Application Data

(62) Division of application No. 09/408,458, filed on Sep. 29, 1999, now Pat. No. 6,570,898.

(51) Int. Cl.[7] .............................................. H01L 21/20
(52) U.S. Cl. ............................... 438/22; 438/41; 438/46
(58) Field of Search ..................... 438/22–47, 479–509

(56) References Cited

U.S. PATENT DOCUMENTS

| | | | | |
|---|---|---|---|---|
| 4,750,183 A | * | 6/1988 | Takahashi et al. |
| 5,509,024 A | * | 4/1996 | Bour et al. |
| 5,559,819 A | * | 9/1996 | Abe et al. |
| 5,583,880 A | * | 12/1996 | Sahkuda et al. |
| 5,923,690 A | * | 7/1999 | Kume et al. |
| 6,232,623 B1 | * | 5/2001 | Morita |
| 6,287,884 B1 | * | 9/2001 | Jie et al. |
| 6,319,742 B1 | * | 11/2001 | Hayashi et al. |

FOREIGN PATENT DOCUMENTS

| JP | 409139543 | * 5/1997 |
|---|---|---|
| JP | 409186404 | * 7/1999 |

* cited by examiner

Primary Examiner—Savitri Mulpuri

(57) ABSTRACT

An index-guided buried heterostructure AlGaInN laser diode provides improved mode stability and low threshold current when compared to conventional ridge waveguide structures. A short period superlattice is used to allow adequate cladding layer thickness for confinement without cracking. The intensity of the light lost due to leakage is reduced by about 2 orders of magnitude with an accompanying improvement in the far-field radiation pattern when compared to conventional structures.

27 Claims, 11 Drawing Sheets

STRUCTURE AND METHOD FOR INDEX-GUIDED BURIED HETEROSTRUCTURE ALGAINN LASER DIODES

CROSS REFERENCE TO RELATED APPLICATIONS

This application is a divisional of application(s) No(s). 09/408,458, filed Sep. 29, 1999 now U.S. Pat. No. 6,570,898.

This application is related to commonly assigned, concurrently filed Bour et al. U.S. patent application entitled "STRUCTURE AND METHOD FOR SELF-ALIGNED, INDEX-GUIDED BURIED HETEROSTRUCTURE AlGaInN LASER DIODES" (application Ser. No. 09/408,415) which is included by reference in its entirety.

FIELD OF INVENTION

This invention relates to nitride based blue laser diodes.

BACKGROUND OF INVENTION

Nitride based blue laser diodes are being developed for printing and optical data storage applications. The first AlGaInN laser diodes were broad area lasers providing no control over the laser diode's various spatial modes. Most applications, however, require the laser diode to operate in a single spatial mode. One way of achieving single spatial mode operation for AlGaInN blue laser diodes is to use a ridge waveguide structure to define a lateral waveguide as described in "Ridge-geometry InGaN multi-quantum-well-structure laser diodes" by S. Nakamura et al., in Applied Physics Letters 69 (10), pp. 1477–1479 which is hereby incorporated by reference in its entirety. While a ridge waveguide provides for single spatial mode emission in blue lasers, the waveguiding provided is relatively weak. The lateral refractive index step is small and is influenced by heating and carrier injection. Additionally, there are fabrication difficulties because the ridge must be etched to extend sufficiently close to the laser active region without the ability to use an etch stop to prevent material damage to the laser active region since chemical etching is not applicable to GaN materials.

To provide stronger mode stability and low threshold current operation, more strongly index-guided diode lasers are required such as those having buried heterostructures that are typically used for InGaAsP fiber optic-communication lasers, or the impurity-induced-layer-disordered waveguide structures used for high-power single-mode AlGaAs laser diodes. Additionally, the use of a buried heterostructure avoids certain fabrication difficulties.

BRIEF SUMMARY OF INVENTION

Both index-guided buried heterostructure AlGaInN laser diodes and self-aligned index guided buried heterostructure AlGaInN laser diodes provide improved mode stability and low threshold current when compared to conventional ridge waveguide structures. A structure for the index-guided buried heterostructure AlGaInN laser diode in accordance with the invention typically uses insulating AlN, AlGaN or p-doped AlGaN:Mg for lateral confinement and has a narrow (typically about 1–5 $\mu$m in width) ridge which is the location of the narrow active stripe of the laser diode which is defined atop the ridge. The narrow ridge is surrounded by an epitaxially deposited film having a window on top of the ridge for the p-electrode contact. The ridge is etched completely through the active region of the laser diode structure to the short period superlattice n-cladding layer. Typically, use of a short period superlattice allows doubling of the cladding layer thickness without cracking. This reduces the intensity of the light lost due to leakage by about 2 orders of magnitude with an accompanying improvement in the far-field radiation pattern in comparison with conventional structures. Junction surfaces are exposed by the ridge etch and these junction surfaces contribute surface states which prevent injected carriers from filling conduction or valence band states needed for a population inversion. However, the epitaxial regrowth of a high bandgap material passivates the surface states because the interface between the overgrown material and the ridge structure is perfectly coherent.

The structure for the self-aligned, index guided, buried heterostructure AlGaInN laser diode uses the p-cladding layer to also function as the burying layer to provide strong lateral optical confinement and strong lateral carrier confinement. The p-cladding layer/burying layer is typically AlGaN:Mg. The structure for the self-aligned, index guided, buried heterostructure laser diode is simpler than for the index-guided, buried heterostructure AlGaInN laser diode. The laser structure is grown through the active quantum well and waveguide region followed by etching a narrow laser ridge down to the n-bulk cladding layer. The p-type cladding/burying layer is then overgrown around the ridge along with the p-contact layer. Subsequent laser processing is simple since the two-step growth process results in a lateral waveguide and carrier confinement structure which does not require the creation of contact windows. Hence, the laser processing required is basically a broad area laser fabrication sequence. Additionally, the comparatively large p-contact area allowed by the self-aligned architecture contributes to a lower diode voltage and less heat during continuous wave operation of the laser diode.

The advantages and objects of the present invention will become apparent to those skilled in the art from the following detailed description of the invention, its preferred embodiments, the accompanying drawings which are illustrative and not to scale, and the appended claims.

DETAILED DESCRIPTION

Figure 1:
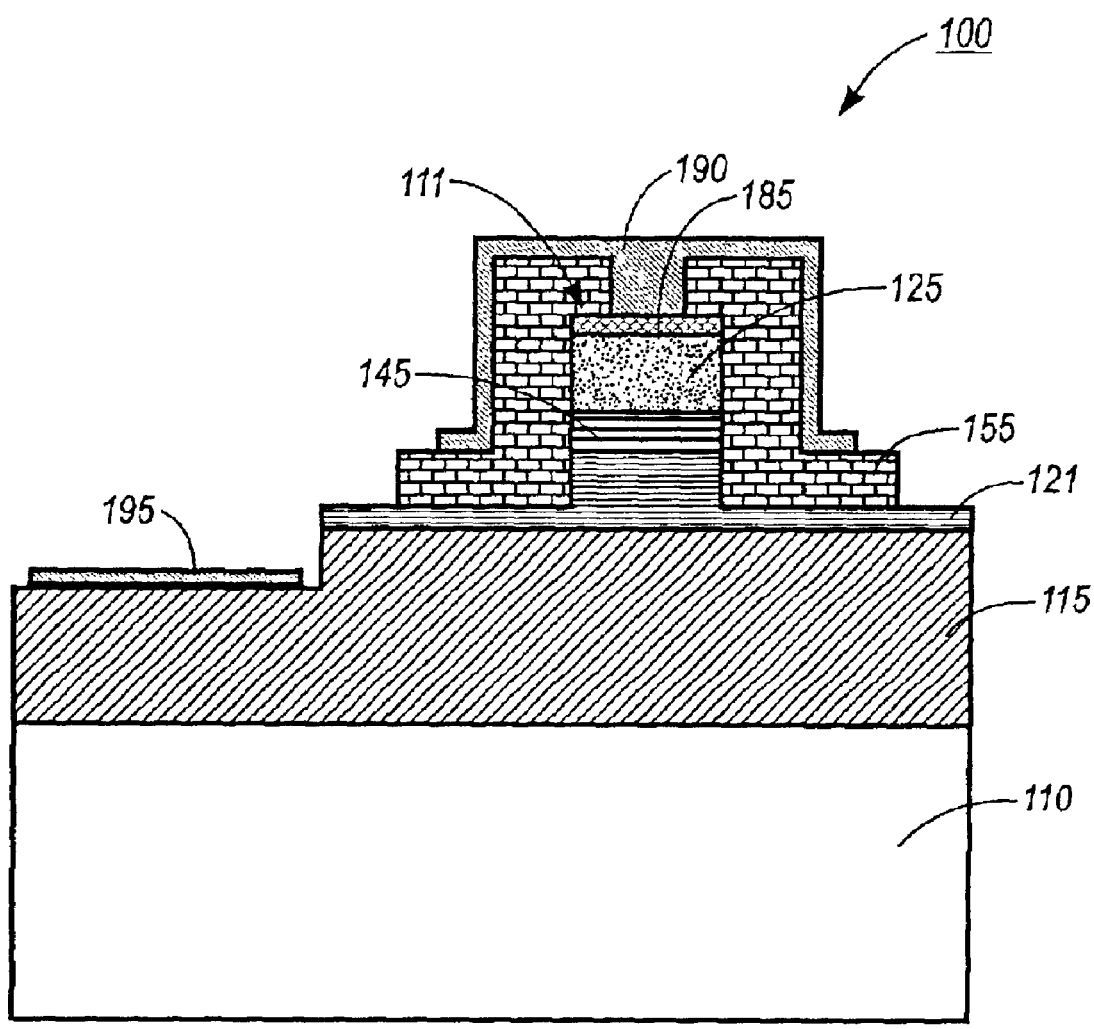
FIG. 1 shows an embodiment of an index guided, buried heterostructure laser diode structure in accordance with the invention.

FIG. 1 shows index-guided, buried heterostructure AlGaInN laser diode structure 100 in accordance with the present invention. GaN:Si layer 115 is positioned on Al$_2$O$_3$ growth substrate 110 and in one embodiment layer 115 may be made of AlGaN:Si to reduce optical leakage. Short period superlattice n-cladding structure 121, typically made up of alternating layers of $Al_{0.15}Ga_{0.85}N$:Si and GaN:Si each with a typical thickness of about 20 Å, is positioned below the GaN n-waveguide layer (not shown in FIG. 1) at the bottom of InGaN multiple quantum well structure 145. Introduction of short period superlattice n-cladding structure 121 allows increased cladding thickness to significantly reduce leakage of the transverse optical mode and results in an improved transverse far-field pattern for laser diode structure 100. For example, a typical leakage of about 7% may be reduced to 0.5%. The far-field beam pattern approaches a Gaussian far-field beam.

P-cladding layer 125, typically $Al_{0.07}Ga_{0.93}N$:Mg, is positioned over the GaN p-waveguide layer (not shown in FIG. 1) which is adjacent to the tunnel barrier layer (not shown in FIG. 1), typically $Al_{0.2}Ga_{0.8}N$:Mg, present at the top of InGaN multiple quantum well structure 145. Layer 185 serves as a capping layer to facilitate ohmic contact. Burying layer 155 is positioned over capping layer 185, typically GaN:Mg, with windows through burying layer 155 to allow p-electrode 190 to contact GaN:Mg layer 185 and n-electrode 195 to contact GaN:Si layer 115.

Burying layer 155, typically insulating AlN or AlGaN, has a low refractive index which results in strong lateral index guiding because the refractive index step is typically around 0.1. With such a large lateral index step, the lateral waveguiding in index-guided, buried heterostructure AlGaInN laser diode structure 100 overwhelms thermal or carrier injection influences to provide a more stable and less astigmatic beam pattern. Burying layer 155 also has a high bandgap energy which results in high lateral carrier confinement.

Undoped AlN films are insulating and prevent formation of a shunt path around InGaN multiple quantum well structure 145. In one embodiment of index-guided, buried heterostructure AlGaInN laser diode structure 100 in accordance with the invention, buried layer 155 is an AlGaN:Mg doped layer as undoped AlGaN may not be insulating depending on growth conditions and the aluminum content. The optoelectronic character of AlGaN depends on growth conditions. For example, it is possible to grow insulating GaN at low temperatures (approximately 900° C.), while at higher growth temperatures GaN tends to have an n-type background conductivity. The precise mechanism for the n-conductivity is presumed to arise from either native defects and or impurities. Oxygen and silicon are both commonly encountered shallow, unintentional donors in GaN. Low aluminum-content AlGaN that is magnesium doped behaves similarly to GaN except that the magnesium acceptor's activation energy increases at the rate of about 3 meV for each percent aluminum added in the alloy up to a 20 percent aluminum content. For aluminum content above 20 percent, unintentional oxygen incorporation may result in uncontrollably high n-type background conductivity. Oxygen is readily incorporated into AlGaN because of the high affinity of aluminum for oxygen and oxygen impurities are typically available from various sources during MOCVD growth. While oxygen impurities may be compensated by magnesium acceptors this is difficult in practice and suggests it would be difficult to make high aluminum content AlGaN burying layers that are insulating. High aluminum content provides better optical and carrier confinement.

Due to the nature of MOCVD growth where atomic hydrogen is available to form neutral complexes with magnesium acceptors, AlGaN:Mg films are insulating as grown and require thermal annealing to activate p-type conductivity. While an insulating burying layer is typically preferable, activated AlGaN:Mg (having p-type conductivity) is also suitable for burying layers if it is difficult or not possible to deposit an insulating burying layer. When buried layer 155 is p-type, a p-n junction is formed at the interface with short period superlattice n-type cladding layer 121. However, the turn-on voltage of this p-n junction is greater than the p-n junction in InGaN multiple quantum well structure 145. This favors the current path preferentially going through InGaN multiple quantum well structure 145. Because no p-GaN cap is deposited over buried layer 155, the contact of p-electrode 190 to buried layer 155 is significantly more resistive than the contact of p-electrode 190 to p-GaN:Mg 185. This further favors current injection into multiple quantum well structure 145.

Figure 2:
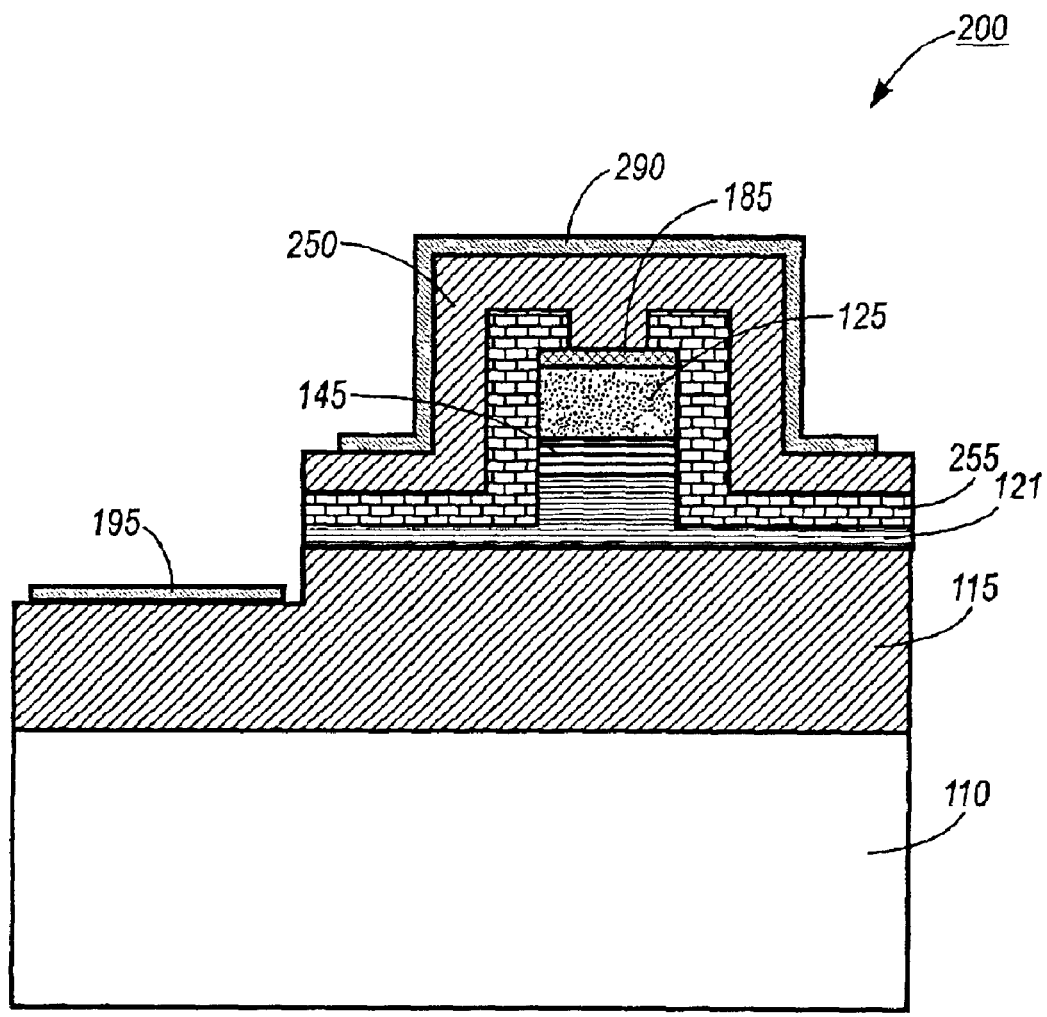
FIG. 2 shows an embodiment of an index guided, buried heterostructure laser diode structure in accordance with the invention.

An n-type burying layer may also be used in order to further reduce optical losses because free-carrier loss is lower for n-type material or if it is only possible to grow n-type AlGaN material. FIG. 2 shows index-guided, buried heterostructure AlGaInN laser diode structure 200 with n-burying layer 255 in accordance with an embodiment of the invention. After regrowth of n-burying layer 255, regrown burying layer is patterned by etching, typically CAIBE. In a second regrowth, n-burying layer 255 is buried with heavily p-doped GaN:Mg layer 250, having a typical doping level of approximately $10^{20}$ Mg atoms/cm$^3$, which also functions as the contact layer. Alternatively, burying layer 255 may also be undoped. P-doped GaN:Mg layer 250 is needed to prevent p-electrode 290 from contacting n-burying layer 255.

Figure 3:
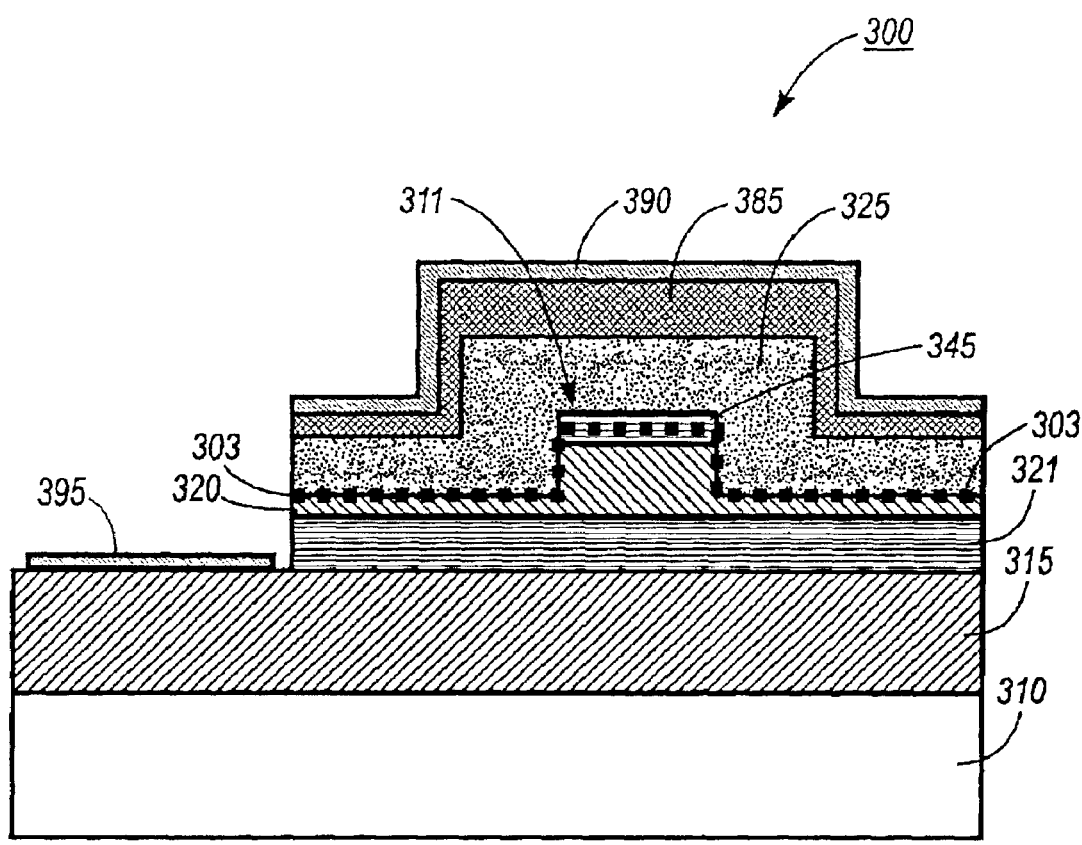
FIG. 3 shows an embodiment of a self-aligned, index guided, buried heterostructure laser diode in accordance with the invention.

FIG. 3 shows self-aligned index-guided, buried heterostructure AlGaInN laser diode structure 300 in accordance with the invention. GaN:Si layer 315 is positioned on $Al_2O_3$ growth substrate 310 and in one embodiment layer 315 may be made of AlGaN:Si. Bulk n-cladding layer 320, typically $Al_{0.07}Ga_{0.93}N$:Si, is positioned below the GaN n-waveguide layer (not shown in FIG. 3) at the bottom of InGaN multiple quantum well structure 345 and over n-cladding short period superlattice 321. N-cladding short period superlattice 321 is typically made up of alternating layers of AlGaN:Si and GaN:Si each with a typical thickness of about 20 Å. Bulk n-cladding 320 prevents injection of carriers from overgrown layer 325, typically $Al_{0.07}Ga_{0.93}N$:Mg to provide optimized transverse waveguiding, into the low bandgap portion of n-cladding short period superlattice 321. Overgrown layer 325 functions both as the burying layer and as the upper p-cladding layer. Hence, the overall thickness of AlGaN in overgrown layer 325 positioned above GaN p-waveguide layer (not shown in FIG. 3) and the tunnel barrier layer, typically $Al_{0.2}Ga_{0.8}N$:Mg, (not shown in FIG. 3) that are located at the top of InGaN multiple quantum well structure 345 is on the order of the thickness used in conventional nitride lasers. Layer 385, typically GaN:Mg, serves as a capping layer to facilitate ohmic contact to p-electrode 390. Dashed line 303 shows the location of the p-n junction in laser diode structure 300.

Overgrown layer 325 functions as both the p-cladding layer and the burying layer to create both strong lateral current confinement and optical confinement. The strong lateral index guiding (typically an index step on the order of 0.1) provided by overgrown layer 325 allows low threshold current and beam stability. Strong index-guiding allows the laser stripe to be made very narrow which facilitates lateral heat dissipation and lowers the required threshold current. The lateral width of InGaN multiple quantum well structure 345 can be made very narrow because of the strong index guiding, typically less than 2 μm, to provide for a low threshold current and for lateral mode discrimination. Self-aligned index-guided, buried heterostructure AlGaInN laser diode structure 300 shown in FIG. 3 provides a greater p-contact area than index-guided, buried heterostructure AlGaInN laser diode structure 100 shown in FIG. 1. A greater p-contact area results in less contact resistance. Lowering contact resistance reduces laser diode heating particularly in continuous wave operation and a wider p-contact also serves to better dissipate heat. Current preferentially flows through InGaN multiple quantum well structure 345 because the p-n junction bandgap is lowest along that portion of dashed line 303.

Figure 4:
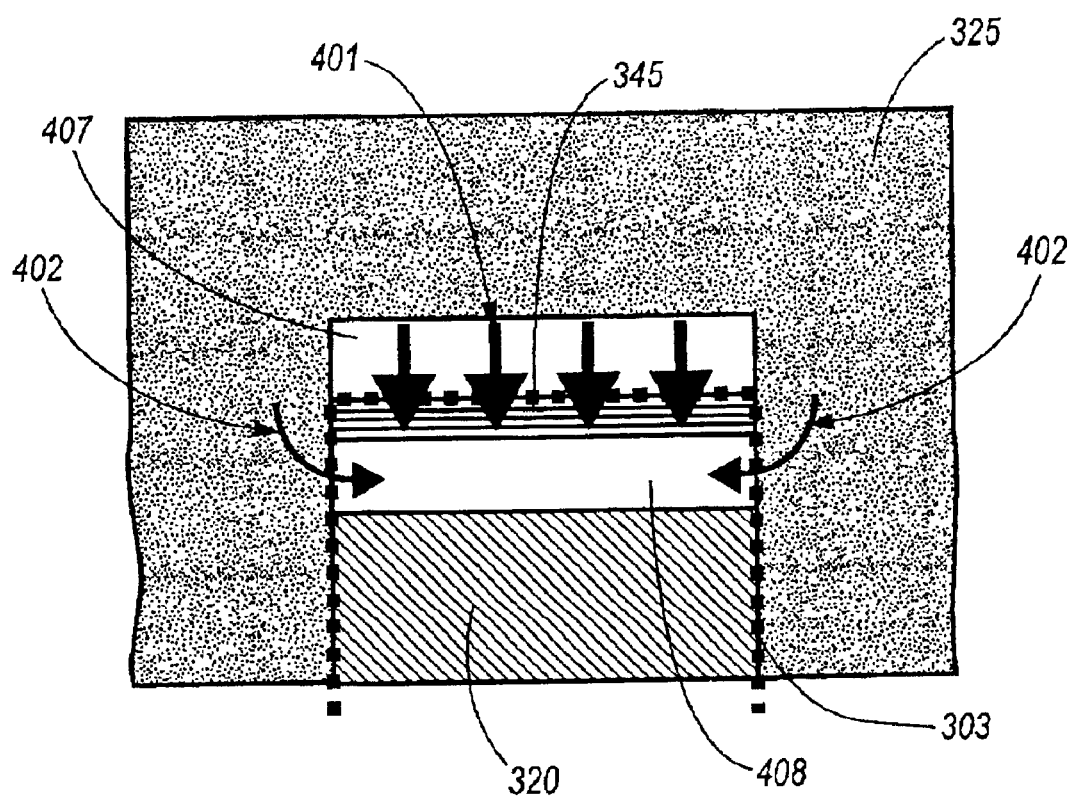
FIG. 4 shows the carrier paths for the embodiment shown in FIG. 3.

FIG. 4 is an expanded view of InGaN multiple quantum well structure 345 in FIG. 3 and shows carrier injection paths 401 and 402 for self-aligned index-guided, buried heterostructure AlGaInN laser diode structure 300. P-doped waveguide 407, typically GaN, and n-doped waveguide 408, typically GaN, are also shown. Dashed line 303 traces the location of the p-n junction. In an embodiment in accordance with the invention operating at a wavelength of about 400 nm, InGaN multiple quantum well structure 345 has a bandgap energy of about 3.1 eV while underlying n-waveguide 408 has a bandgap energy of about 3.4 eV. Hence, the turn-on voltage for the p-n junction associated with InGaN multiple quantum well region 414 is lower than that of the p-n junction associated with n-waveguide 408 and carriers are preferentially injected along injection path 401 into InGaN multiple quantum well region 414 when laser diode 300 is forward-biased.

The 300 meV difference between the bandgap energy of InGaN multiple quantum well region 414 and n-waveguide 408 may in some cases be insufficient for confining carrier injection to injection path 401 and some carriers may be injected along injection path 402 across the p-n junction at the sidewalls of n-waveguide 408. Because carriers injected across the p-n junction at the sidewalls of n-waveguide 408 do not populate the quantum wells, these carriers do not contribute to higher optical gain and cause a higher threshold current to be required. Operation at wavelengths higher than about 400 nm such as about 430 nm would increase the bandgap energy differential so that carrier injection across the p-n junction at the sidewalls of n-waveguide 408 is significantly reduced.

Figure 5:
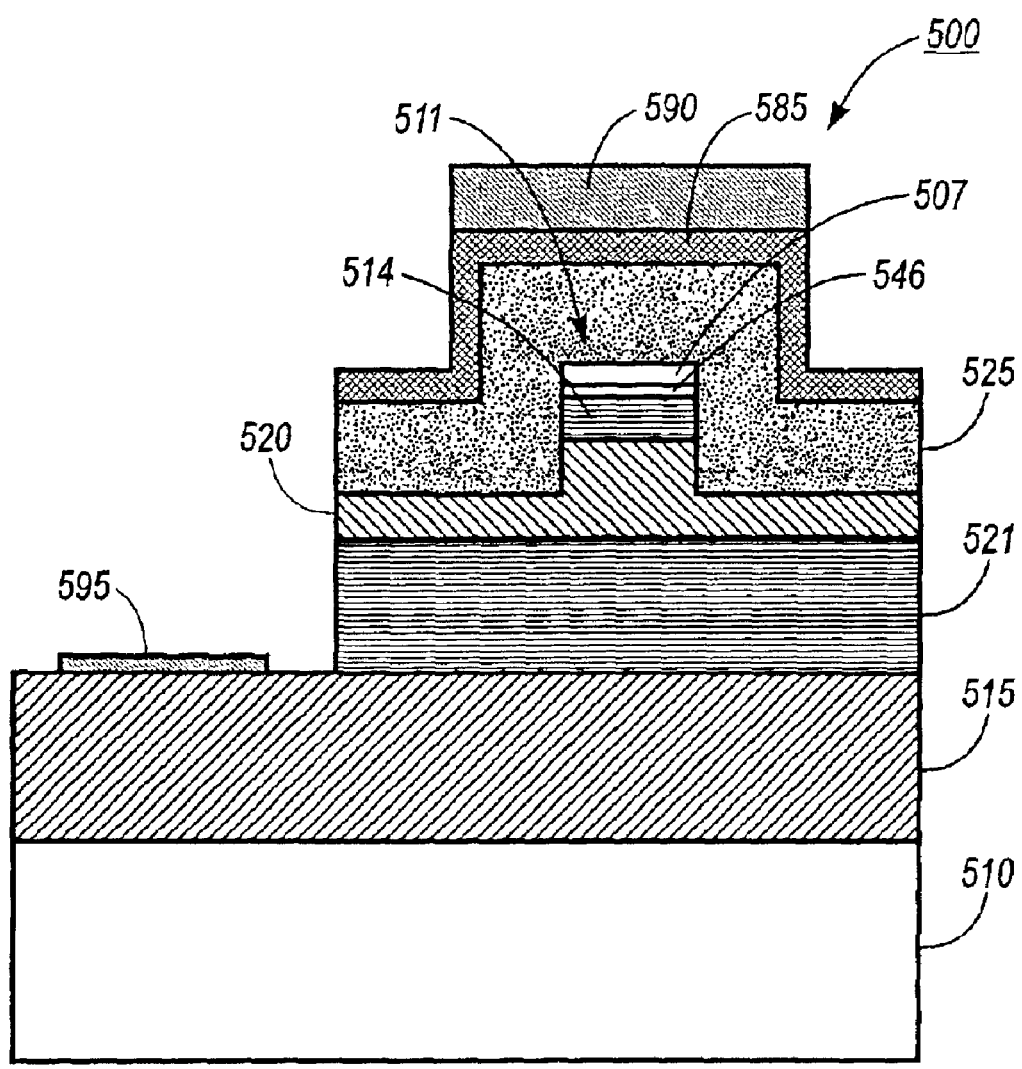
FIG. 5 shows an embodiment of a self-aligned, index guided, buried heterostructure laser diode in accordance with the invention.

Lateral injection of carriers across the p-n junction at the sidewalls of GaN n-waveguide 408 may be reduced by using an inverted asymmetric waveguide structure as shown in FIG. 5 which eliminates n-waveguide 408. This eliminates carrier injection along injection path 402 shown in FIG. 4. Tunnel barrier layer 546 lies over InGaN multiple quantum well region 514 and is typically AlGaN with an aluminum content between 5 to 15 percent. P-waveguide 507, typically GaN, is located over tunnel barrier layer 546. P-cladding layer 525, typically AlGaN:Mg, covers p-waveguide 507 and buries entire laser ridge structure 511. Capping layer 585, typically GaN:Mg, provides contact to p-contact 590.

InGaN multiple quantum well region 514 is positioned on bulk n-cladding layer 520, typically AlGaN:Si. Bulk n-cladding layer 520 is placed over short period superlattice n-cladding structure 521, typically made up of alternating layers of AlGaN:Si and GaN:Si with each with a typical thickness of about 20 Å. Bulk n-cladding layer 520 blocks charge carriers from being injected from p-cladding layer 525 into the typically lower bandgap GaN:Si layers of short period superlattice n-cladding structure 521. Introduction of short period superlattice cladding structure 521 allows cladding layers with the same average aluminum content as bulk n-cladding layer 520, typically about 8 percent, to be grown to a thickness of more than 1 micron whereas bulk n-cladding layer 520 is usually limited to a typical thickness of about 0.5 µm before cracking occurs. Increased thickness provided by short period superlattice cladding structure 521 significantly reduces leakage of the transverse optical mode and results in an improved transverse far-field pattern for laser diode structure 500. For example, a typical leakage of about 7% may be reduced to 0.5%. The far-field beam pattern approaches a Gaussian far-field beam. N-layer 515, typically AlGaN:Si or GaN:Si, underlies short period superlattice cladding structure 521 and is placed over substrate 510, typically $Al_2O_3$.

Index-guided, buried heterostructure AlGaInN laser diode structure 100 in FIG. 1 may be fabricated by first CAIBE (chemically assisted ion beam etch) etching through layers 185, 125, 145 and 121 to expose n-type layer 115 for deposition of n-electrode 195. Growth related to GaN is disclosed in U.S. patent application Ser. No. 09/288,879 entitled "STRUCTURE AND METHOD FOR ASYMMETRIC WAVEGUIDE NITRIDE LASER DIODE" by Van de Walle et al. hereby incorporated by reference in its entirety. A possible issue with p-type material growth is magnesium turn on delay due to $Cp_2Mg$ sticking to gas lines rather than entering the reactor. Magnesium turn on delay may be compensated for by pre-flowing $Cp_2Mg$ into the reactor prior to heating and growth. The magnesium is switched to vent during the heatup and then switched back into the reactor without turn on delay when magnesium doping is desired.

In one embodiment in accordance with the present invention, photoresist is applied to GaN:Mg layer 185 to define the top of ridge structure 111. However, before applying the photoresist it is advantageous to activate GaN:Mg layer 185. The activation avoids possible hydrogen evolution during processing which causes bubbling under the photoresist. Activation is typically performed in one of two ways. Normal thermal activation may be used by heating to approximately 850° C. for 5 minutes in a nitrogen environment. Alternatively, GaN:Mg layer 185 may be exposed to intense UV light to release the hydrogen preventing possible thermal degradation of the surface. The photoresist stripe is lithographically patterned with the photoresist stripe aligned along the <1100> crystallographic direction of GaN layer 185. Subsequently, the stripe is etched to produce a ridge structure 111, typically having a width from 1 to 5 µm.

Ridge structure 111 is formed by CAIBE etching through layers 185, 125, 145 to short period superlattice n-cladding structure 121. Note that the length axis of ridge structure 111 is oriented perpendicular to the set of {1100} planes and aligned along the <1100> crystallographic direction due to the orientation of the photoresist stripe prior to etching. This orientation has been found to reduce surface pitting.

Cleaning is performed prior to epitaxial regrowth and includes photoresist removal using a combination of dissolution in acetone and ashing in an oxygen plasma. Further cleaning is performed using aqua regia then $H_2SO_4:H_2O_2:H_2O$ mixed in the ratio 4:1:1, respectively and used as-mixed (hot). A final rinse is performed with de-ionized water followed by drying in pure nitrogen.

The regrowth occurs at a stabilized temperature of 900° C. in an ammonia/hydrogen gas stream. When the growth temperature has stabilized the reactants trimethylaluminum, trimethylgallium and biscyclopentadienylmagnesium are introduced into the reactor. Insulating overgrowth of burying layer 155 is accomplished by growing an undoped film at low temperature ($T_{growth}<900°$ C.). Epitaxial regrowth of burying layer 155, typically made of insulating AlN or AlGaN, is performed to surround the ridge structure. Alternatively, a p-doped burying layer 155, typically AlGaN:Mg may be grown. An opening is etched using CAIBE into burying layer 155 down to p-cap 185 to open up a narrow window for contacting p-cap layer 185 with p-electrode 190.

Further processing of index-guided, buried heterostructure AlGaInN laser diode structure 100 involves p-dopant activation by annealing at 850° C. for 5 minutes in a nitrogen ambient. Palladium p-contact metal deposition is evaporatively deposited and alloyed at 535° C. for 5 minutes. Mirror facets (not shown) are formed by cleaving or etching. If mirror facets are etched, the etch of the first mirror facet is performed along with the mesa etch. N-metal deposition is performed of Ti/Al. Finally, n-electrode 195 and p-electrode 190 are deposited and high reflection coatings $TiO_2/SiO_2$ are applied to the first and second mirrors.

Processing for laser structure 200 is similar to that of laser structure 100. However, in FIG. 2 n-type burying layer 255, typically AlGaN:Si, is regrown followed by regrowth of p-burying layer 250, typically GaN:Mg. Additionally, after n-metal deposition takes place, high temperature dielectric deposition, typically of SiN or $SiO_2$, is performed over the entire surface using PECVD (plasma enhanced chemical vapor deposition). The deposited dielectric is then patterned to create windows for n-electrode 195 and p-electrode 190. Patterning is used instead of a photoresist mask because the deposition temperature for the dielectric is approximately 250° C. and photoresist is limited to temperatures below about 120° C. This makes a restricted contact window for p-electrode 290 contacting p-burying layer 250 to avoid current injection outside the laser stripe. Alternatively, ion implantation at energies typically from about 80–120 keV may be used to create the restricted window by masking the window regions and then performing the ion implantation.

Processing for self-aligned, index guided, buried heterostructure AlGaInN laser diode structures 300 (see FIG. 3) and 500 (see FIG. 5) is similar to that for laser diode structures 100 and 200. A key difference of the self-aligned, index guided, buried heterostructure AlGaInN laser structures 300 and 500 is that the deposited p-doped layers 325 and 525 serve both as p-cladding layers and as burying layers. Due to the self-aligned structure of laser diodes 300 and 500 there is also no etching through burying layers 325 and 525, respectively. Note that processing is performed so that the length axis of both ridge structure 311 (see FIG. 3) and ridge structure 511 (see FIG. 5) is aligned along the <1100> crystallographic direction to reduce surface pitting.

FIGS. 6–11 show processing steps for making a laser diode structure similar to self-aligned, index guided, buried heterostructure AlGaInN laser diode structure 300. Tunnel barrier layer 646, if desired, lies between multiple quantum well region 345 and p-doped waveguide 407.

Figure 6:
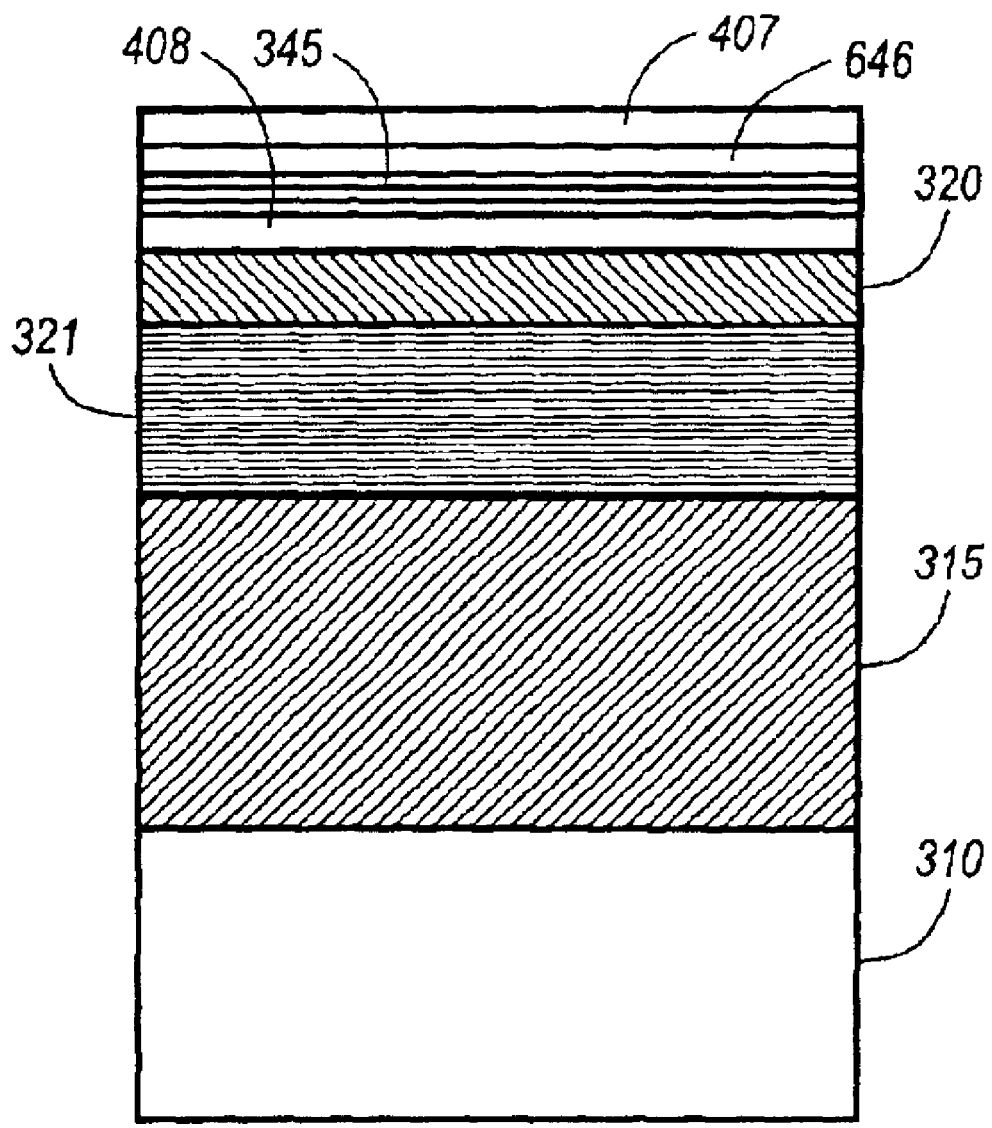
FIGS. 6–11 show process steps for making a self-aligned, index guided, buried heterostructure laser diode in accordance with the invention.
Figure 7:
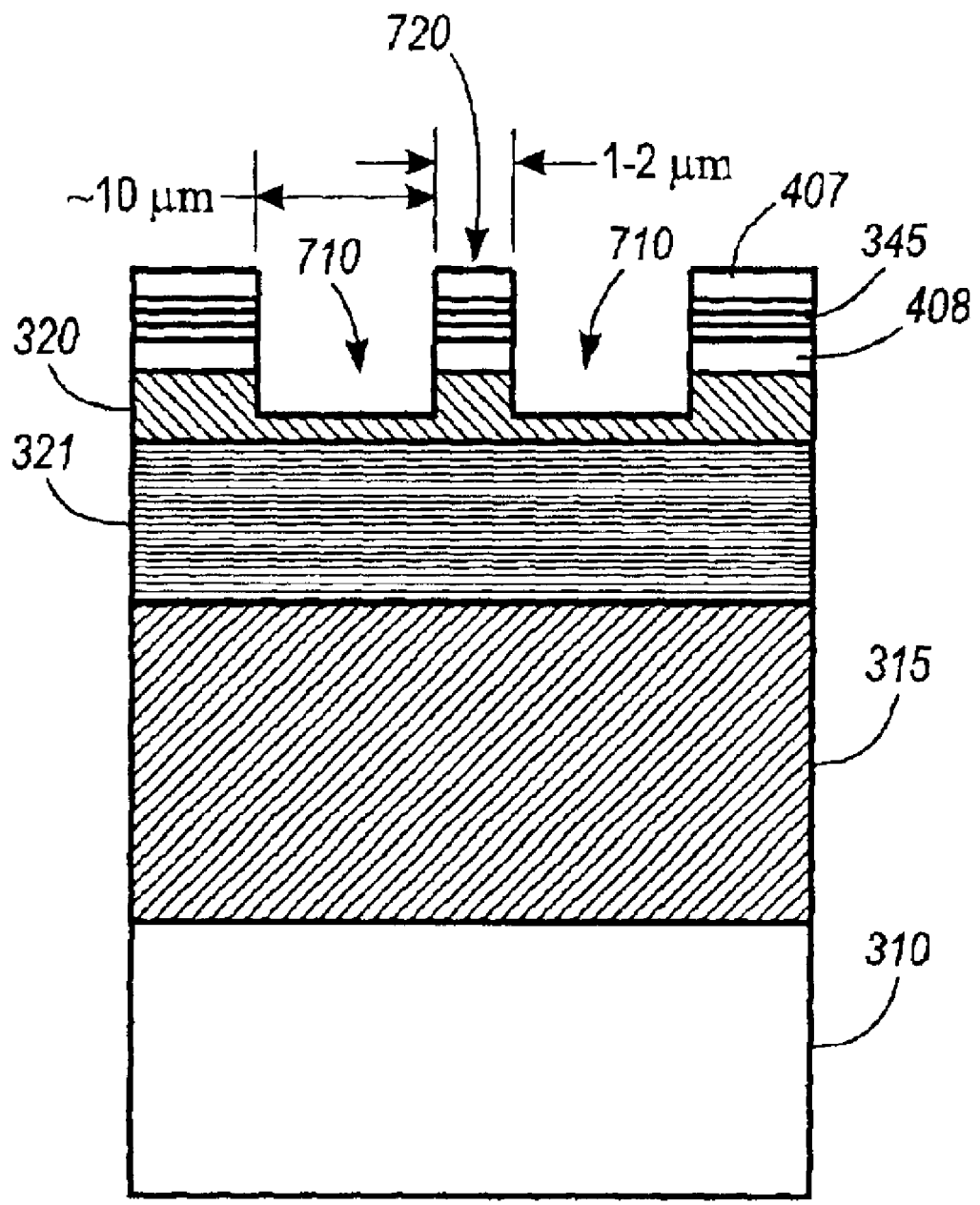
Figure 8:
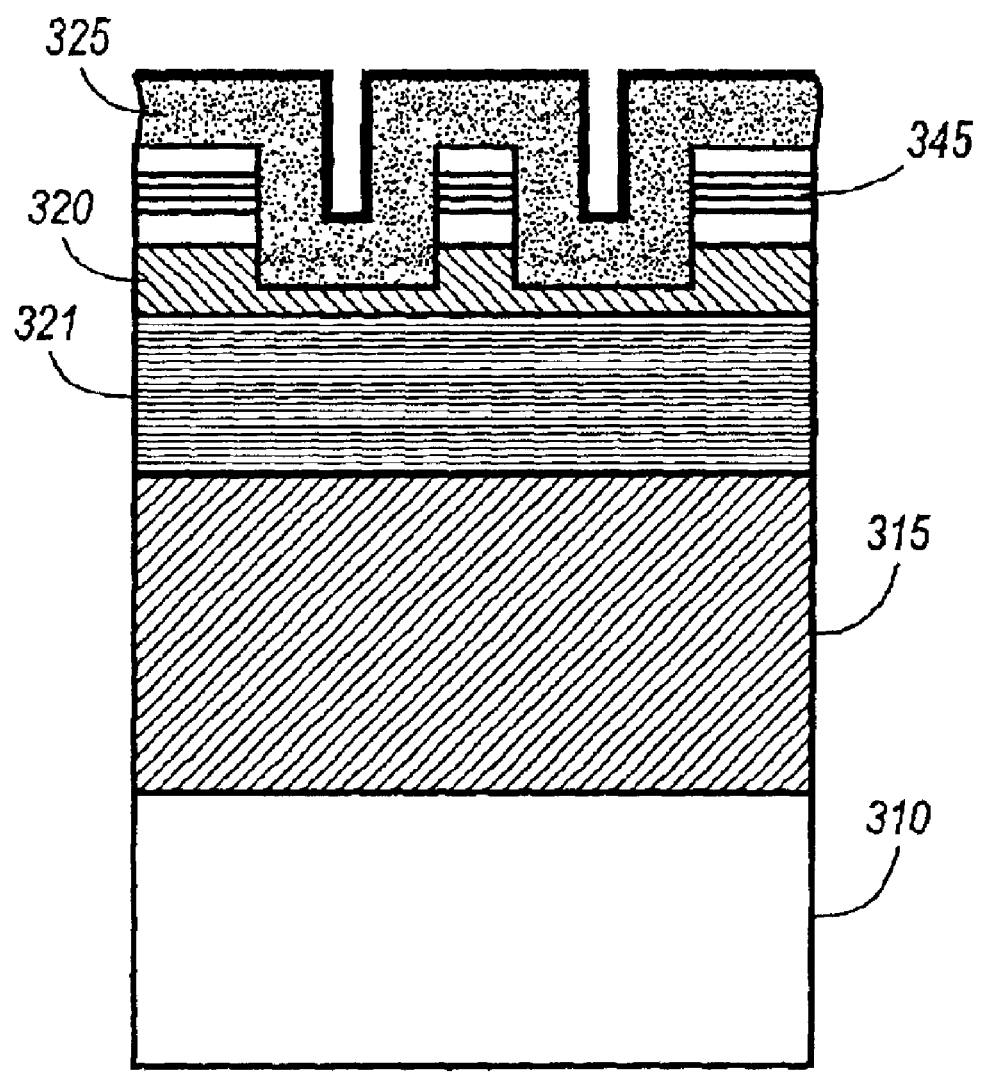

FIG. 6 shows the deposited epitaxial structure up to and through p-doped waveguide region 407. Note that no p-cladding or capping layers are present. FIG. 7 shows the CAIBE etching of trenches 710, typically about 10 $\mu$m wide, surrounding ridge 720 which is typically about 1–2 $\mu$m wide. The etching must penetrate into, but not through bulk n-cladding layer 320. This results in an etch of about 300 nm for a typical thickness of multiple quantum well region 345 and waveguides 407 and 408. FIG. 8 shows MOCVD growth of p cladding layer 325 to a typical thickness of about 0.5–1.0 $\mu$m. P-capping layer 385 is also grown to a typical thickness of about 0.1 $\mu$m over the structured surface.

The remaining process sequence is similar to that of conventional ridge-waveguide nitride lasers except that the ridge-etch step is not performed.

Figure 9:
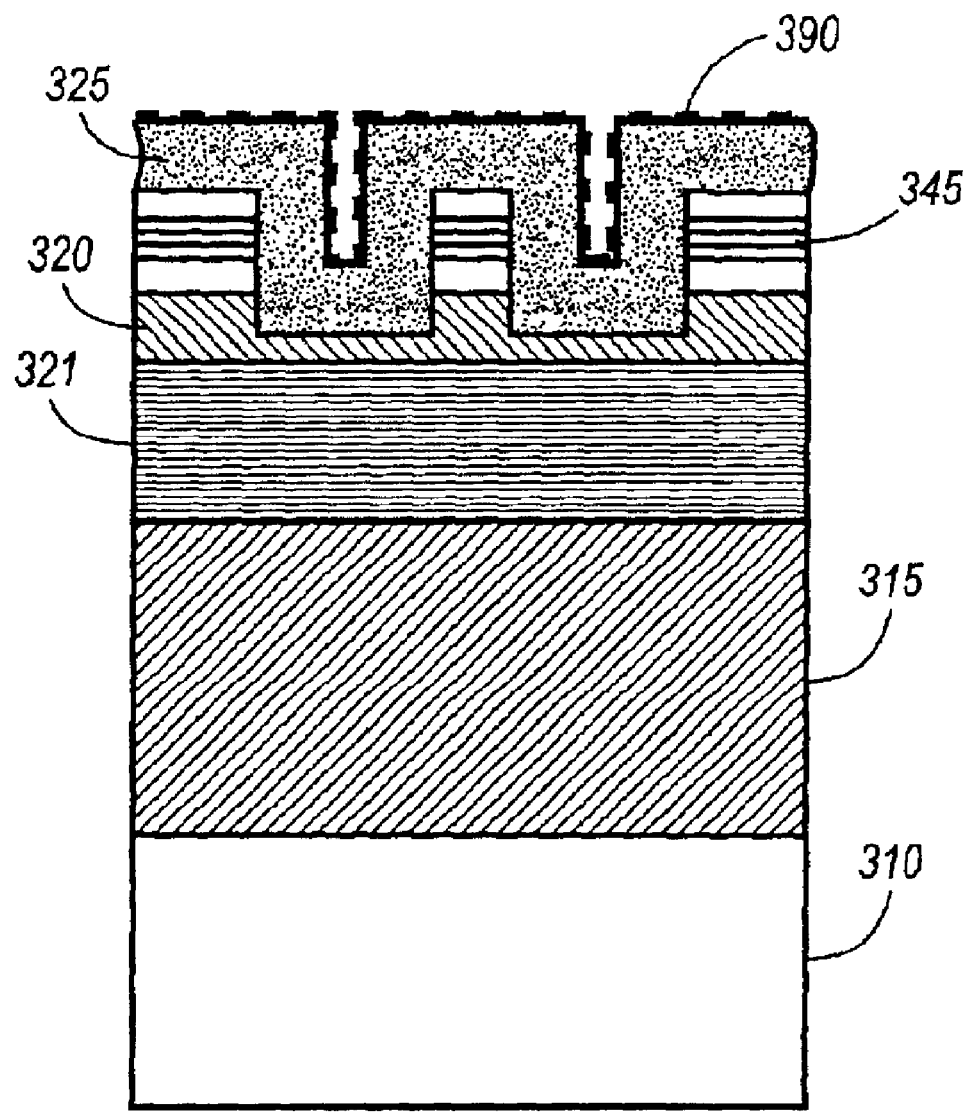
Figure 10:
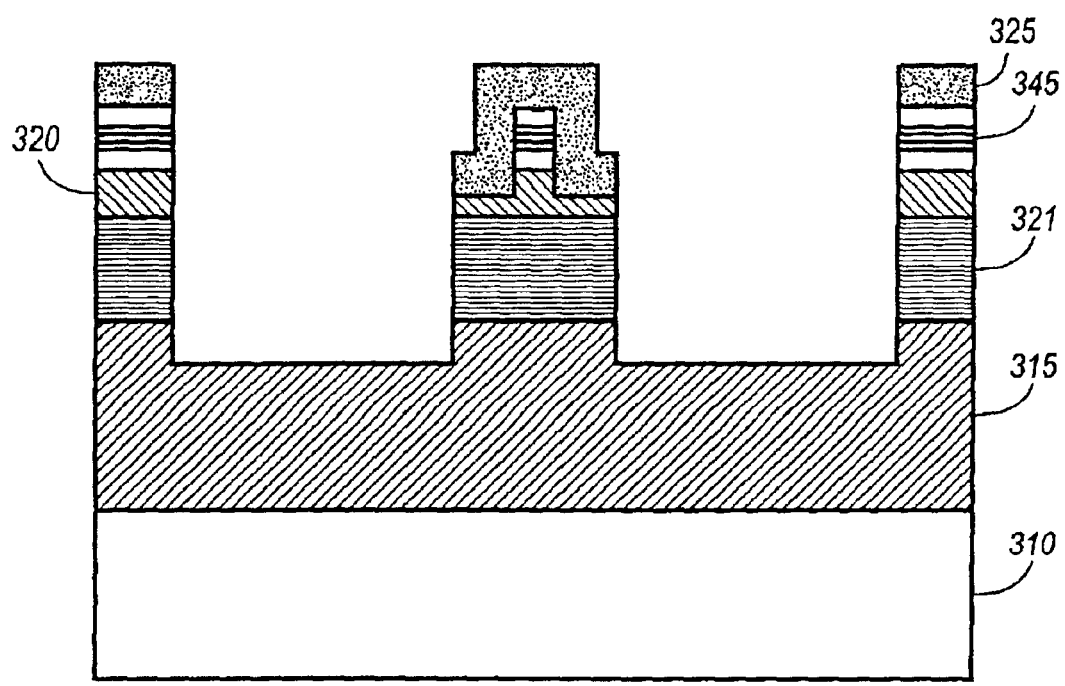
Figure 11:
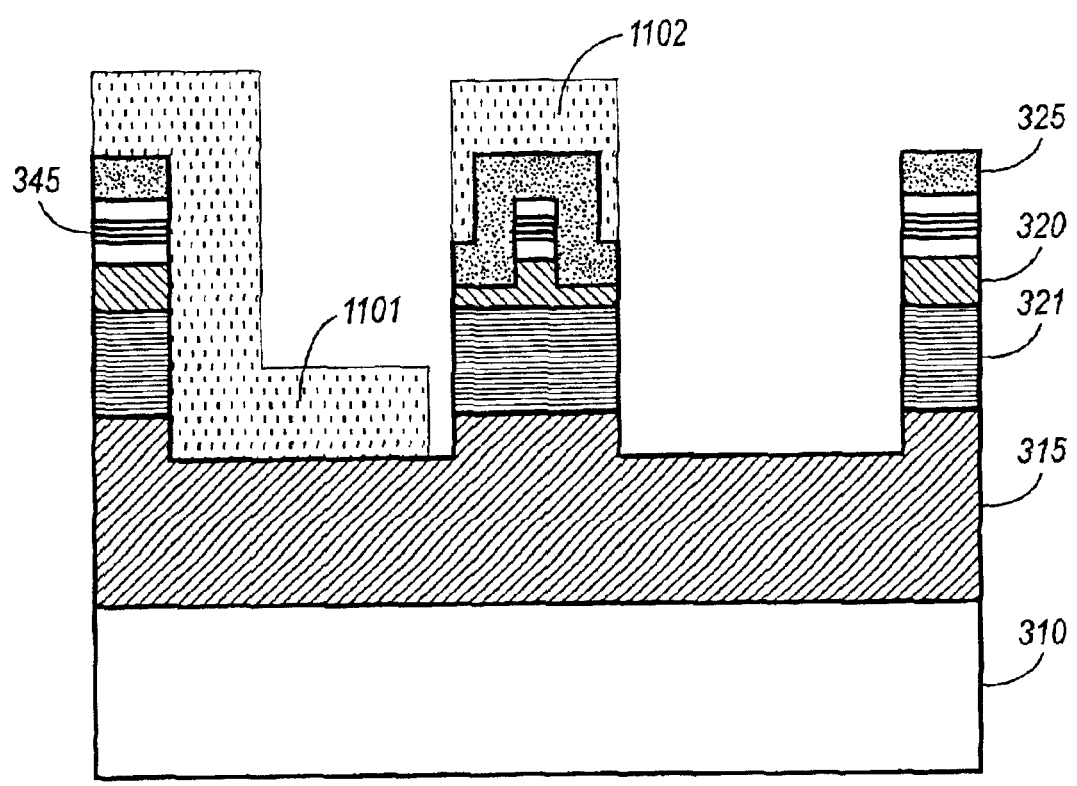

FIG. 9 shows deposition of p-metal layer 390, typically palladium alloy, at 535° C. for 5 minutes in a nitrogen ambient. FIG. 10 shows CAIBE etching of p-metal layer 390 and CAIBE etching to a depth of about 2 $\mu$m to penetrate through n-cladding short period superlattice 321 into GaN:Si layer 315. This etch exposes the area for n-lateral contact 1101. The first and second mirrors (not shown) are also CAIBE etched in this step. Liftoff metallization (typically Ti—Al) is performed for n-contact pad 395. FIG. 10 shows metallization, typically Ti—Au, to build up metal thickness on n-contact 1101 and p-contact 1102. Finally, $SiO_2/TiO_2$ mirror coating evaporation is performed.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A method for making a nitride light emitting structure comprising the operations of:
    providing a ridge structure having an active region;
    adding a burying layer including nitride, the material in the burying layer doped throughout in one of a group of n-doped, p-doped or undoped, the burying layer overlying said ridge structure, said ridge structure forming a guiding surface where the burying layer contacts the active region, the guiding surface providing index guiding in the ridge structure during operation of the light emitting structure.

2. The method of claim 1 wherein the ridge structure includes a lower cladding layer below the active region, said lower cladding layer being a shortperiod superlattice.

3. The method of claim 1 wherein said ridge structure is oriented along the <1100> crystallographic direction.

4. The method of claim 1 wherein said burying layer is p-doped throughout.

5. The method of claim 1 wherein a tunnel barrier layer adjoins a multiple quantum well structure in the ridge structure.

6. A method for making a nitride light emitting structure comprising the operations of:
    providing a ridge structure having a multiple quantum well structure;
    adding a first burying layer including nitride overlying said ridge structure, the first burying layer doped throughout with a single carrier type of one of a group of either n type, p type or intrinsic, said first burying layer having an opening to said third surface of said ridge structure for electrical contact, a guiding surface forming where the first burying layer contacts the multiple quantum well structure, the guiding surface providing index guiding in the ridge structure during operation of the light emitting structure; and
    adding a second burying layer overlying said first burying layer, such that said second burying layer is in contact with said a top surface of said ridge structure.

7. The method of claim 6 wherein said first burying layer is n-doped.

8. The method of claim 6 wherein said second burying layer is comprised of magnesium doped GaN.

9. The method of claim 6 wherein said ridge structure is oriented along the <1100> crystallographic direction.

10. The method of claim 6 wherein said cladding structure is a shortperiod superlattice.

11. The method of claim 6 wherein the operation of providing a ridge structure is an etching process.

12. The method of claim 11 wherein the etching is a reactive ion etch.

13. The method of claim 11 wherein the etching is an ion beam etching.

14. The method of claim 6 wherein the operation of adding a first burying layer is by growing the first burying layer.

15. The method of claim 12 wherein a metal organic chemical vapor deposition is used in the growing process.

16. The method of claim 13 wherein the opening in the burying layer is formed by etching the burying layer.

17. The method of claim 1 wherein the providing of the ridge structure uses an etching process.

18. The method of claim 17 wherein the etching process is a reactive ion etch.

19. The method of claim 17 wherein the etching process is an ion beam etch.

20. The method of claim 17 wherein the etching process is a chemical assisted ion beam etching process.

21. The method of claim 17 wherein the etching process is en inductively coupled plasma etch.

22. The method of claim 1 wherein the operation of adding a burying layer involves growing the burying layer.

23. The method of claim 1 wherein metal organic chemical vapor deposition is used to grow the burying layer.

24. The method of claim 1 further comprising the operation of:

etching an opening into the burying layer, the opening to provide an electrical contact.

25. The method of claim 6 wherein the first burying layer is p-doped.

26. A method for making a nitride light emitting structure comprising the operations of:

providing a ridge structure having an active region;

adding a burying layer including nitride, the burying layer n-doped throughout, the burying layer overlying said ridge structure, said ridge structure forming a guiding surface where the burying layer contacts the active region, the guiding surface providing index guiding in the ridge structure during operation of the light emitting structure.

27. A method for making a nitride light emitting structure comprising the operations of:

providing a ridge structure having an active region;

epitaxially depositing a burying layer including nitride, the burying layer undoped throughout, the burying layer overlying said ridge structure, said ridge structure forming a guiding surface where the burying layer contacts the active region, the guiding surface providing index guiding in the ridge structure during operation of the light emitting structure.

* * * * *